United States Patent
Levin et al.

(10) Patent No.: US 6,571,376 B1
(45) Date of Patent: May 27, 2003

(54) METHOD AND APPARATUS FOR ANALOG COMPENSATION OF DRIVER OUTPUT SIGNAL SLEW RATE AGAINST DEVICE IMPEDANCE VARIATION

(75) Inventors: Alex Levin, Port Orchard, WA (US); Kim Soi Er, Sungai Ara. (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/037,686

(22) Filed: Jan. 3, 2002

(51) Int. Cl.[7] .............................................. G06F 17/50
(52) U.S. Cl. ..................... 716/5; 716/4; 716/6; 326/87; 327/112
(58) Field of Search .......................... 716/1–18; 326/26, 326/31, 112, 87; 327/108, 112

(56) References Cited

U.S. PATENT DOCUMENTS

| | | | | |
|---|---|---|---|---|
| 5,534,791 A | * | 7/1996 | Mattos et al. ................. | 326/27 |
| 6,051,995 A | * | 4/2000 | Pollachek .................... | 326/87 |
| 6,154,083 A | * | 11/2000 | Gaudet et al. .............. | 327/312 |
| 6,353,346 B1 | * | 3/2002 | Chan .......................... | 327/112 |
| 6,396,137 B1 | * | 5/2002 | Klughart .................... | 257/691 |
| 2002/0188915 A1 | * | 12/2002 | Hayes .......................... | 716/4 |

OTHER PUBLICATIONS

Garcia et al., "Design of a Slew Rate Controlled Output Buffer," IEEE, 1998, pp. 147–150.*

* cited by examiner

Primary Examiner—Vuthe Siek
(74) Attorney, Agent, or Firm—Blakely, Sokoloff, Taylor & Zafman LLP

(57) ABSTRACT

A method and apparatus for analog compensation of driver output signal slew rate against device impedance variation is described. The method includes a signal termination device coupled to a driver output pad. The driver includes a plurality of pull-up devices where each pull-up device is coupled between a driver supply voltage and the signal termination device. In addition, corresponding pull-down devices are coupled between a driver ground and the signal termination device. The driver includes pull-up and pull-down compensation resistive elements coupled in series between selected pull-down/pull-up devices and the signal termination device. Accordingly, the pull-up and pull-down compensation resistive elements provide analog compensation of a driver output signal slew rate against device impedance variation. Also, a slew rate of the driver output signal is within a predetermined slew rate range in order to avoid uncontrolled fast switching as well as unnecessarily slow switching in the driver output signal.

18 Claims, 14 Drawing Sheets

CONVENTIONAL I/O DRIVER 100

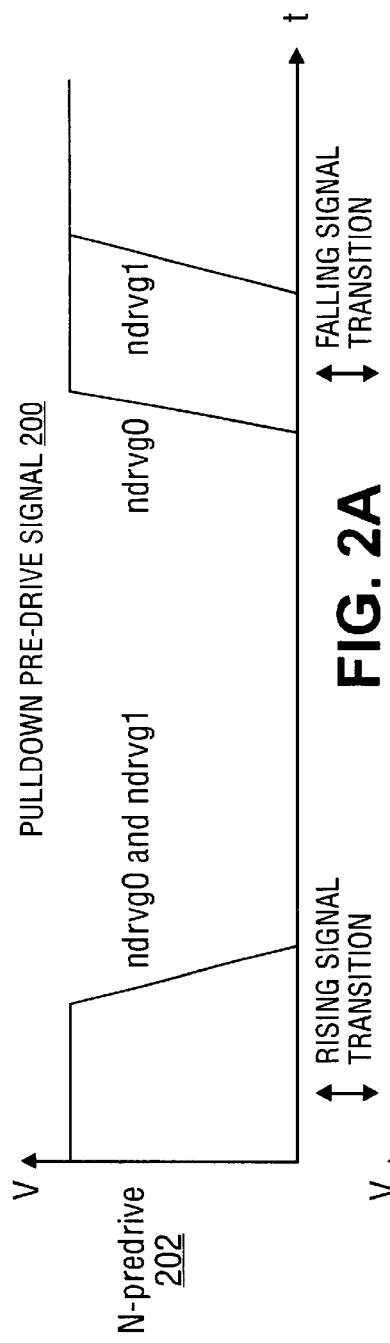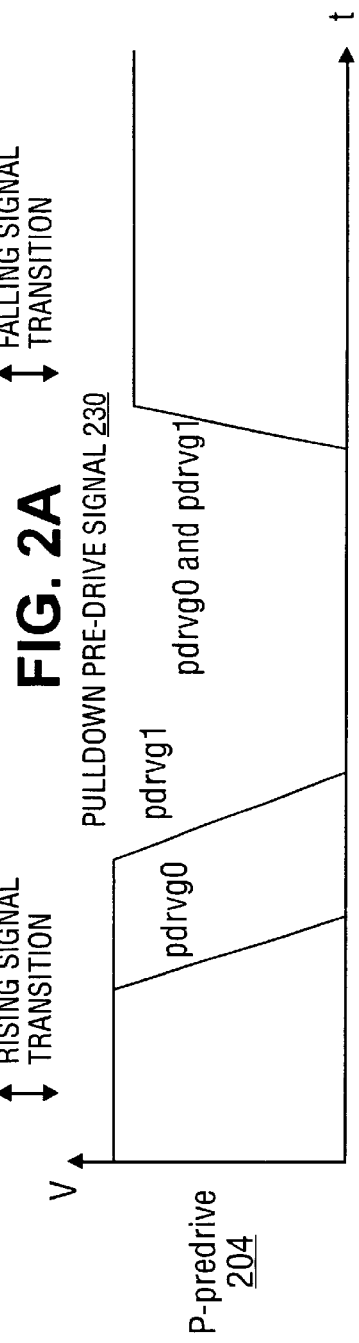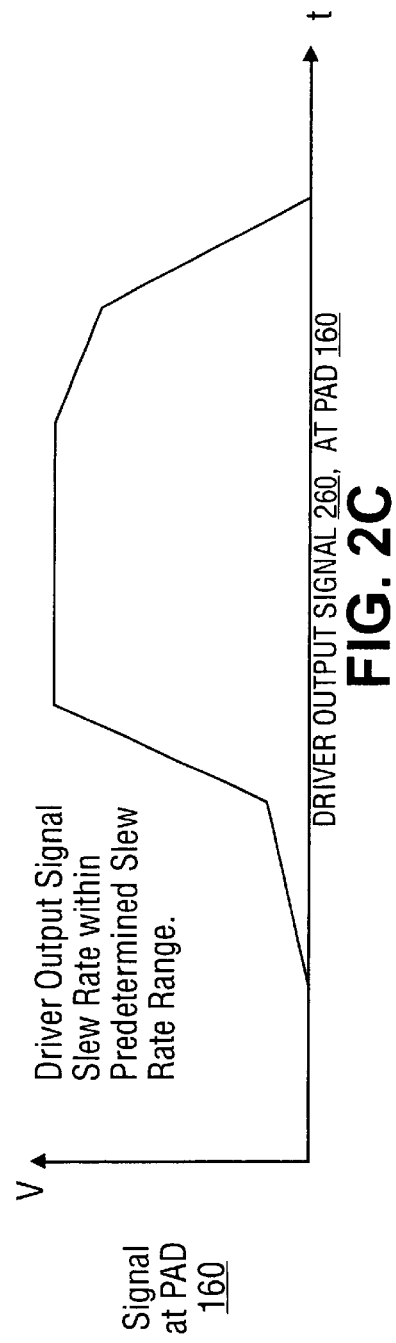

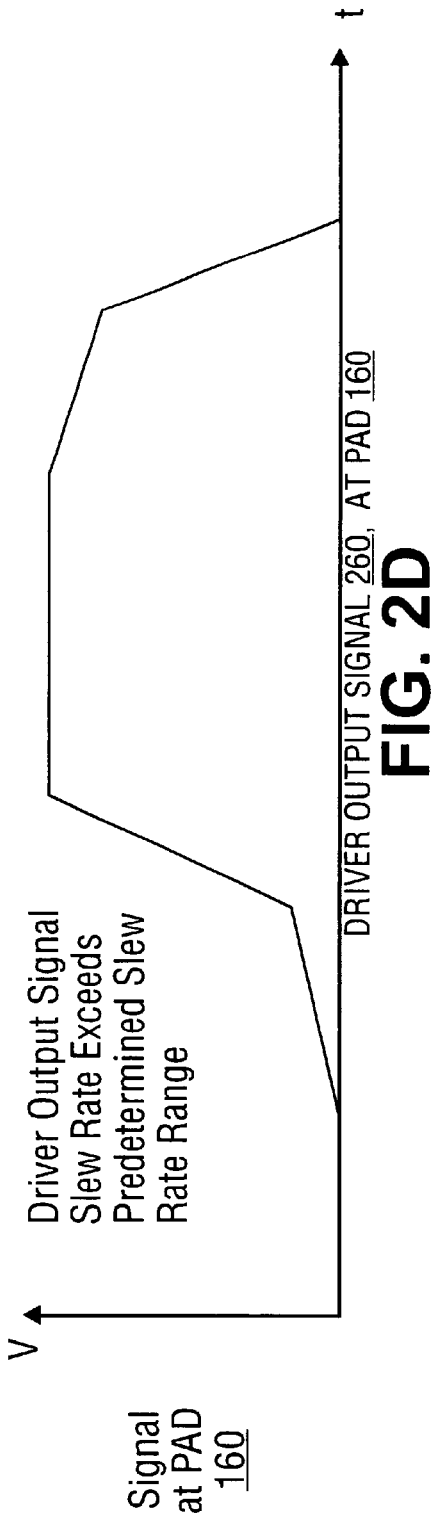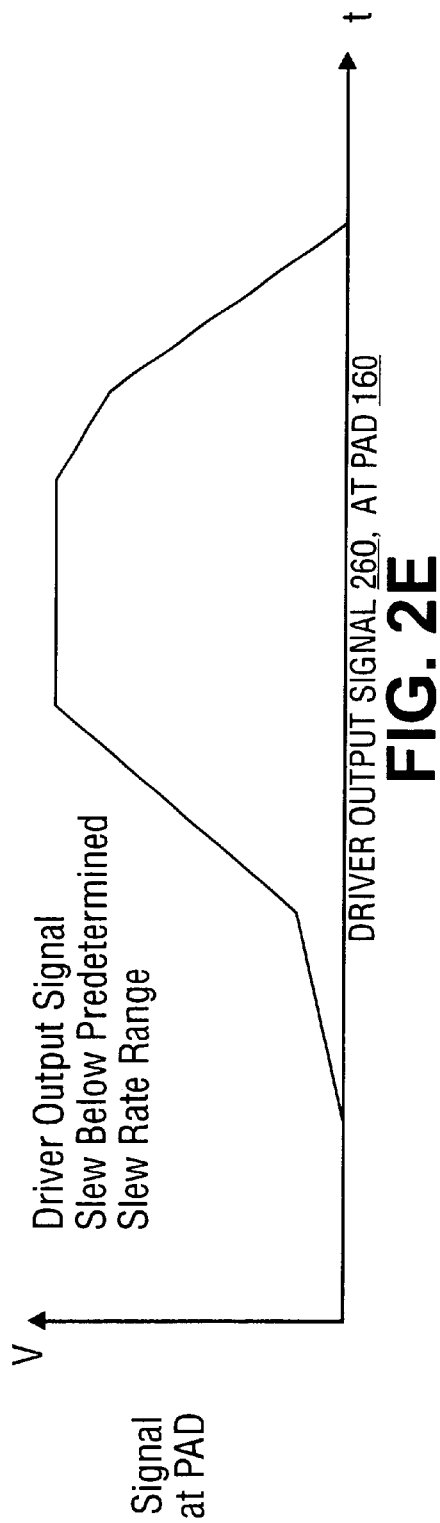

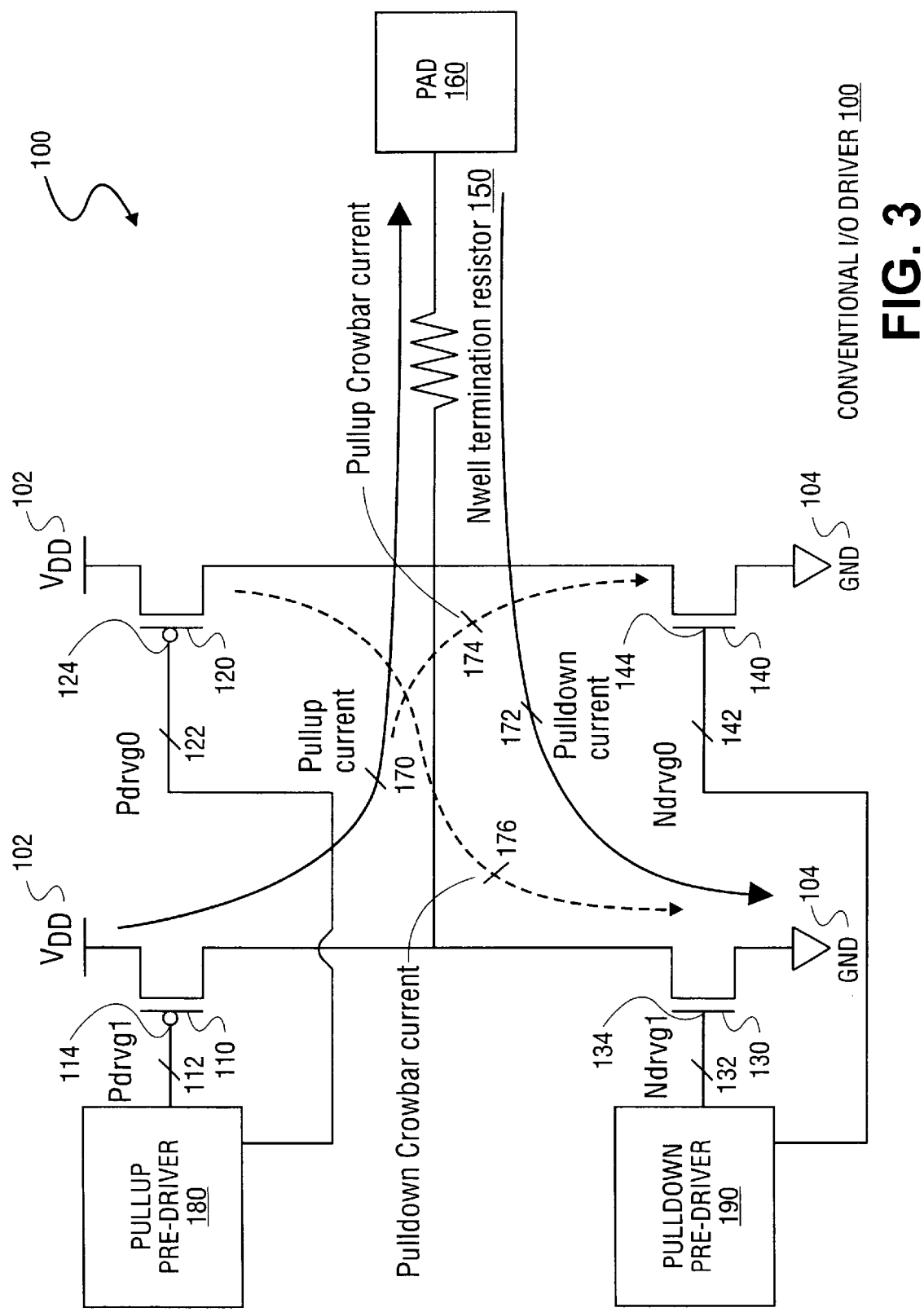

METHOD AND APPARATUS FOR ANALOG COMPENSATION OF DRIVER OUTPUT SIGNAL SLEW RATE AGAINST DEVICE IMPEDANCE VARIATION

FIELD OF THE INVENTION

The present invention relates generally to an I/O driver. In particular, the present invention relates to an apparatus and method for analog compensation of driver output signal slew rate against device impedance variation.

BACKGROUND OF THE INVENTION

High speed I/O (input/output) buffers can improve transmitted and received signal quality through the use of on-chip signal termination. One technique that is often used to provide on-chip signal termination is the formation of an Nwell resistor structure as the die termination. Nwell material is often selected due to its highly resistive structure. In addition to being highly resistive, an Nwell structure is simple to create and consumes a relatively small die area compared to, for example a polyresistor.

Unfortunately, Nwell material and Nwell resistive elements created using such material are prone to wide variations in resistivity. In fact, materials and processing used to create resistive elements using Nwell material are subject to wide variations. Therefore, without some sort of external compensation, the resistance of the termination device can easily vary by 300%. Consequently, because output signals are driven through such on-chip resistive termination, the effect of the resistance variation on an output signal slew rate can be significant. Therefore compensation is required to regulate the output driver slew rate according to the strength of the on-chip termination resistor.

As a result, most sensitive high speed output drivers use external compensation to maintain correct functionality across the wide resistive range of the Nwell on-chip termination resistor. Such conventional techniques often utilize a digital approach, which directs the activation and de-activation of various buffers in order to regulate the output drivers. As such, digital regulation of the output drivers is required in order to compensate for the variations in the on-chip resistive termination. Usually, this is performed using a digital compensation block requiring extra pins at higher manufacturing costs.

Accordingly, compensation circuits, particularly ones which employ a digital approach, have historically been trouble spots, due to their complexity, the need for calibration and their potential to interfere with normal buffer operation. In other words, circuit designers are required to provide some sort of compensation mechanism for interfacing with legacy drivers in order to meet timing specifications. Moreover, such compensation mechanisms are required due to the fact that signals subject to inadequate/ excessive on-chip termination will incur signaling integrity problems.

As such, signals driven through excessive on-chip termination will incur substantial delays in completing falling/ rising signal transition. As a result, the system will incur timing problems, such as violation of set-up time at signal receivers due to the delay in rising/falling signal transition. Conversely, when the on-chip termination resistance is too small, uncontrolled fast signaling of output signal slew rates will result. As a result, this uncontrolled fast switching creates potential signal integrity problems and signal corruption due to reflection. Moreover, electromagnetic interference is aggravated when uncontrolled fast switching of output signals results. Therefore, there remains a need to overcome one or more of the limitations in the above-described, existing art.

BRIEF DESCRIPTION OF THE DRAWINGS

The features, aspects, and advantages of the present invention will become more fully apparent from the following Detailed Description and appended claims when taken in conjunction with accompanying drawings in which:

FIGS. 2A–2E depict timing diagrams illustrating pre-drive signals resulting in a driver output signal at the pad of the I/O driver, as depicted in FIG. 1.

FIG. 3 depicts a block diagram illustrating a crowbar current within the conventional I/O driver as depicted in FIG. 1.

DETAILED DESCRIPTION

Figure 1:
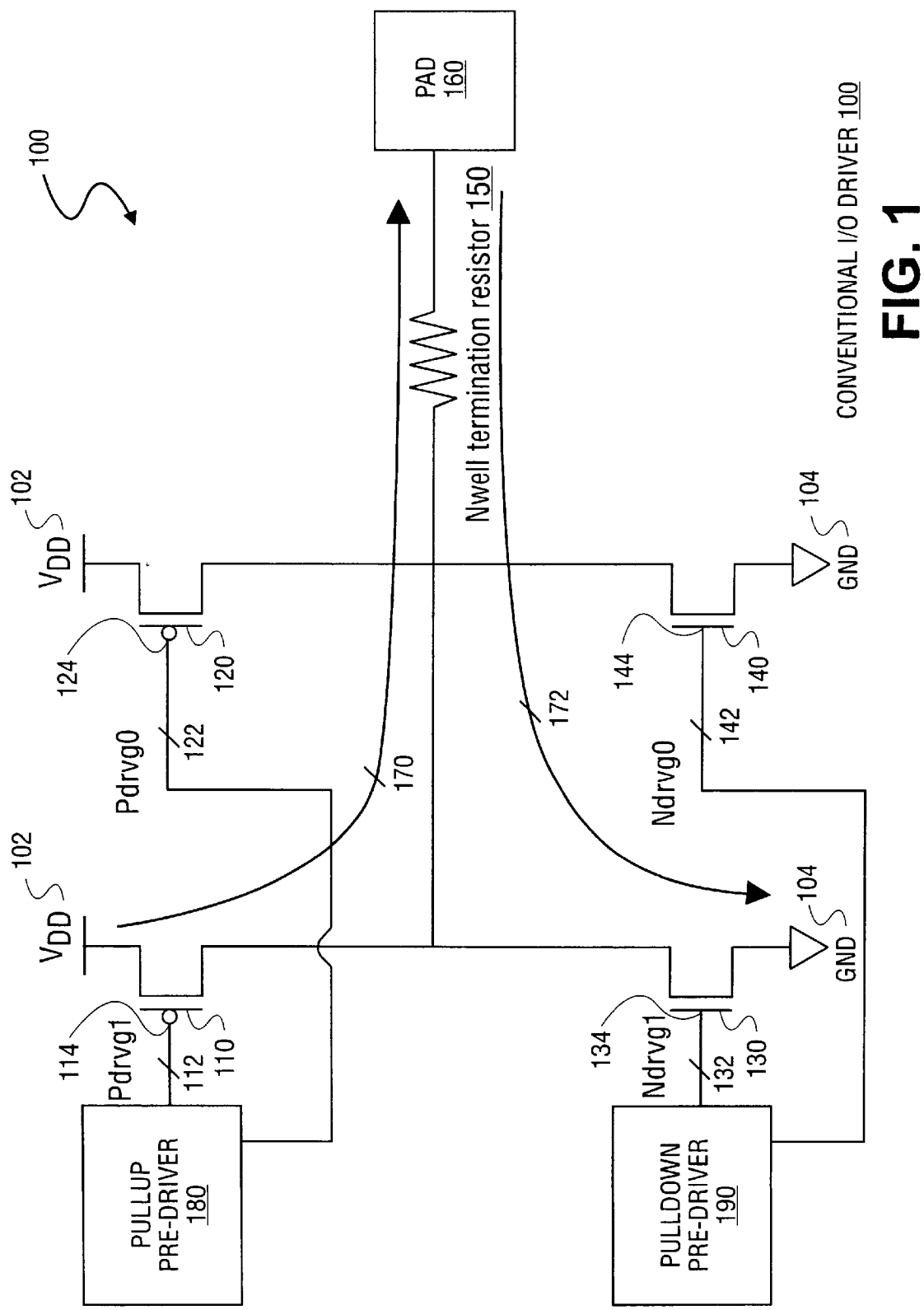
FIG. 1 depicts a block diagram illustrating a conventional input/output (I/O) driver as known in the art.

A method and apparatus for analog compensation of driver output signal slew rate against termination device impedance variation are described. In one embodiment, the present invention describes an I/O driver. The I/O driver includes a signal termination device coupled to a driver output pad. In addition, the driver includes a plurality of pull-up devices where each pull-up device is coupled between a driver supply voltage and the signal termination device. The driver also includes corresponding pull-down devices coupled between a driver ground and the signal termination device. Finally, the driver includes a pull-up compensation resistive element coupled in series between a selected pull-down device and the signal termination device, as well as a pull-down compensation resistive element coupled in series between a selected pull-up device and the signal termination device. Accordingly, the pull-up and pull-down compensation resistive elements provide analog compensation of a driver output signal slew rate against driver impedance variation. In addition, a slew rate of the driver output signal is assured to be within a predetermined slew rate range in order to avoid uncontrolled fast switching in the driver output signal as well as unnecessarily slow switching of the driver output signal.

In a further embodiment, the present invention describes a circuit design automation technique. The method of the design includes simulation of an I/O driver including a signal termination device set to a predetermined resistance value. Once simulated, a crowbar current is generated within the I/O driver. Utilizing the crowbar current, compensation resistances within the I/O driver are swept until a driver output signal is within a predetermined slew rate range. Once the compensation resistances are determined, an I/O driver is formed according to the compensation resistances such that the compensation resistances achieves analog compensation of the driver output signal slew rate against device impedance variation.

In the following description, for the purposes of explanation, numerous specific details are set forth in order to provide a thorough understanding of the present invention. It will be apparent, however, to one skilled in the art that the present invention may be practiced without some of these specific details. For example, various signals, layout patterns, memory cell configurations and circuits, and logic circuits may be modified according to the teachings of the present invention.

In addition, the following description provides examples, and the accompanying drawings show various examples for the purposes of illustration. However, these examples should not be construed in a limiting sense as they are merely intended to provide examples of the present invention rather than to provide an exhaustive list of all possible implementations of the present invention. In other instances, well-known structures and devices are shown in block diagram form in order to avoid obscuring the details of the present invention.

One of skill in the art will immediately appreciate that the invention can be practiced with computer system configurations other than those described below, including hand-held devices, multiprocessor systems, microprocessor-based or programmable consumer electronics, digital signal processing (DSP) devices, network PCs, minicomputers, mainframe computers, and the like. The invention can also be practiced in distributed computing environments where tasks are performed by remote processing devices that are linked through a communications network. The required structure for a variety of these systems will appear from the description below.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression.

Thus, one skilled in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

In an embodiment, the methods of the present invention are embodied in machine-executable instructions. The instructions can be used to cause a general-purpose or special-purpose processor that is programmed with the instructions to perform the steps of the present invention. Alternatively, the steps of the present invention might be performed by specific hardware components that contain hardwired logic for performing the steps, or by any combination of programmed computer components and custom hardware components.

In one embodiment, the present invention may be provided as a computer program product to enable circuit design automation, which may include a machine or computer-readable medium having stored thereon instructions which may be used to program a computer (or other electronic devices) to perform a process according to the present invention. The computer-readable medium may include, but is not limited to, floppy diskettes, optical disks, Compact Disc, Read-Only Memory (CD-ROMs), and magneto-optical disks, Read-Only Memory (ROMs), Random Access Memory (RAMs), Erasable Programmable Read-Only Memory (EPROMs), Electrically Erasable Programmable Read-Only Memory (EEPROMs), magnetic or optical cards, flash memory, or the like.

Accordingly, the computer-readable medium includes any type of media/machine-readable medium suitable for storing electronic instructions. Moreover, the present invention may also be downloaded as a computer program product. As such, the program may be transferred from a remote computer (e.g., a server) to a requesting computer (e.g., a client). The transfer of the program may be by way of data signals embodied in a carrier wave or other propagation medium via a communication link (e.g., a modem, network connection or the like).

System Architecture

Referring now to FIG. 1, FIG. 1 depicts a conventional I/O driver 100 as known in the art. As depicted, the driver 100 includes a pair of pull-up devices (110 and 120) and a pair of opposed pull-down devices (130 and 140). However, as described above, the I/O driver 100 includes a signal termination device, which is depicted as utilizing an Nwell termination resistor 150. As described above, the Nwell termination resistor is susceptible to substantial variations (device impedance variation) in resistance once fabricated on a die. In fact, device impedance variations of the termination device can vary by as much as 300%.

The conventional I/O driver 100 also includes a pull-up pre-driver 180 and a pull-down pre-driver 190. The pull-up pre-driver 180 directs pull-up signals (PDRVG1) 112 and (PDRVG0) 122. As will be illustrated with reference to FIGS. 2A–2C, the pull-up driver activates the PDRVG1 signal 112, as well as the PDRVG0 signal 122 in order to cause a rising signal transition at the driver output pad 160. Conversely, in order to generate a falling signal transition at the output buffer pad 160, the driver 100 includes a pull-down pre-driver 190. The pull-down pre-driver 190 activates a pair of signals (NDRVG1 132 and NDRVG0 142), which when activated drop the voltage level at the driver output pad in order to achieve a falling signal transition.

However, due to the fact that the I/O driver 100 utilizes an Nwell termination resistor 150 for signal termination, variations of the Nwell termination resistor 150 will affect a slew rate of the driver output signal at the output pad 160. For instance, if the fabricated Nwell termination resistor 150 is generated having an excessive resistance value, the amount of current 170/172 that can be provided to the driver output pad 160 during a rising signal transition or pulled from the driver output pad 160 during a falling signal transition will be very slow. As a result, the amount of time required for completion of a falling signal transition or a rising signal transition will be slow, which can lead to problems in meeting timing specifications, such as set-up time of various devices that may be connected to the driver.

Referring now to FIGS. 2A–2E, FIG. 2A illustrates activation of the pull-down signals NDRVG0 132 and NDRVG1 142 during a rising signal transition at the output pad 160. As illustrated, to generate a rising signal transition at the output pad 160 of the driver 100 as depicted in FIG. 1, the pull-down devices 130 and 140 are de-activated by lowering the gate voltage level to a predetermined level. Once the pull-down devices 138 and 140 are turned off, the pull-up devices 110 and 120 are turned on, as illustrated in FIG. 2B, by dropping the voltage level to a predetermined value. However, in the embodiment depicted, pull-up leg 120 is considered the weaker of the pull-up legs and is activated prior to activation of pull-up leg 110.

As such, referring to FIG. 2C, FIG. 2C illustrates optimal output driver signal slew rates due to absence of device impedance variation in the termination resistance. As illustrated, the rising signal transition at the output pad 160 is initially slow while the weak pull-up leg 120 is turned on. However, once both pull-up legs 110 and 120 are turned on, the driver 100 drives high at a greater slew rate due to activation of the strongest pull-up leg 120. As illustrated by FIG. 2C, the driver output pad signal slew rate is within a desired slew rate range due to an absence of signal termination device impedance variation.

Referring again to FIG. 2A, in order to generate a falling signal transition, pull-up legs 110 and 120 are turned off, as illustrated by FIG. 2B, by the pull-up signals PDRVG0 122 and PDRVG1 112. However, the weaker of the pull-down legs 140 is activated prior to activation of the stronger pull-down leg 130. As illustrated in FIG. 2C, while the pull-down leg 140 begins the falling signal transition, the signal transitions at a slower rate. However, once both pull-down legs 130 and 140 are activated, the rising signal transition occurs, such that a slew rate of the output signal is within a predetermined slew rate range. Unfortunately, due to the fact that the I/O driver 100 (FIG. 1) utilizes an Nwell resistor as a signal termination device 150, variations of the Nwell termination resistor 150 will affect the slew rate of the driver output signal at the output pad 160, as illustrated with reference to FIGS. 2D and 2E.

Referring to FIG. 2D, FIG. 2D illustrates a scenario where a final resistance value of the fabricated Nwell termination resistor 150 results in an inadequate termination resistance. As illustrated by the timing diagram depicted in FIG. 2D, the pull-up signal PDRVG0 starts to pull the pad 160 high, as it is initially turned on, as depicted with reference to FIGS. 2A and 2B, while all of the pull-down devices are turned off. However, once the PDRVG1 signal is turned on, the I/O driver 100 will drive strongly due to the fact that the strongest pull-down leg is now turned on. As a result, the slew rate of the driver output signal will exceed the predetermined slew rate range. A similar situation occurs during pull-down of the output buffer pad 160, such that once the stronger of the pull-down legs is turned on, the output signal slew rate will exceed the pre-determined range. In one embodiment, the pre-determined slew rate range is 0.4 v/ns to 1.0 v/ns. As described above, an extremely high slew rate, due to abnormally low Nwell termination resistance 150 can lead to problems, such as voltage reflections and interference in received or transmitted signals.

Conversely, as illustrated with reference to FIG. 2E, FIG. 2E illustrates a scenario where the final fabricated resistance value of the Nwell termination resistor 150 is at an excessive resistance value. As illustrated by the timing diagram of FIG. 2E, the driver output signal slew rate will transition at a rate which is below the pre-determined range as described above. As a result, the amount of time required for completion of the falling signal transition or rising signal transition will be slow, which can lead to problems in meeting timing specifications, such as set-up times of various devices that may be connected to the driver 100.

Figure 4A:
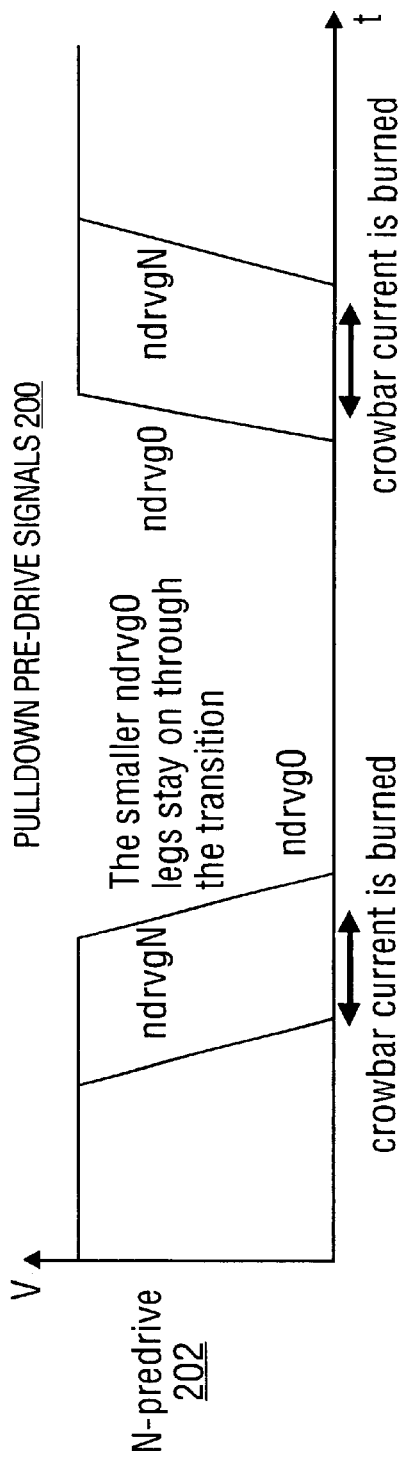
FIGS. 4A and 4B depict timing diagrams illustrating pre-drive signals resulting in a crowbar current within the I/O driver, as depicted in FIG. 3.
Figure 4B:
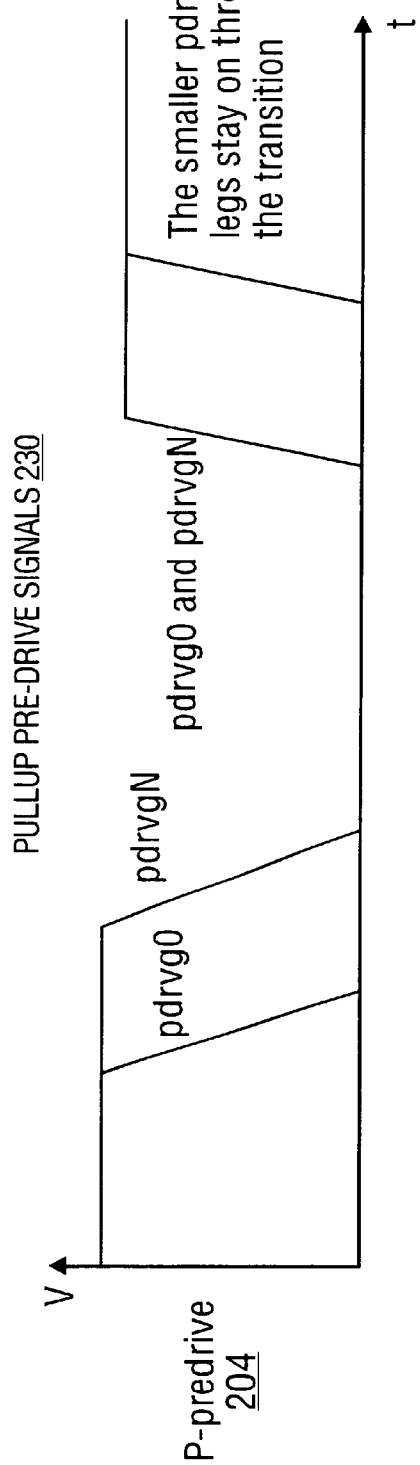

Referring now to FIG. 3, FIG. 3 depicts the conventional I/O driver as originally depicted in FIG. 1 in order to illustrate pull-down crowbar current 176 and pull-up crowbar current 174. As illustrated with reference to FIGS. 4A and 4B, during a rising signal transition, a smaller of the pull-down signals, such as for example NDRVG0, may stay on through all or a portion of the rising signal transition. When such a scenario occurs, a crowbar current is burned, as illustrated by crowbar current 174. Conversely, during a falling signal transition, a smaller of the pull-up legs may be left on during all or a portion of the falling signal transition to generate pull-down crowbar current 176.

Unfortunately, such crowbar currents will result in a reduced slew rate of the driver output signals due to the fact that the crowbar currents will either divert current from the pad 160 during a rising signal transition or reduce the amount of current that is pulled from the pad 160 during a falling signal transition. Accordingly, the combination of variations in termination resistances, as well as crowbar currents, can lead to problems in meeting timing specifications. As a result required slew rate ranges often cannot be met by I/O drivers in conventional devices.

Figure 5:
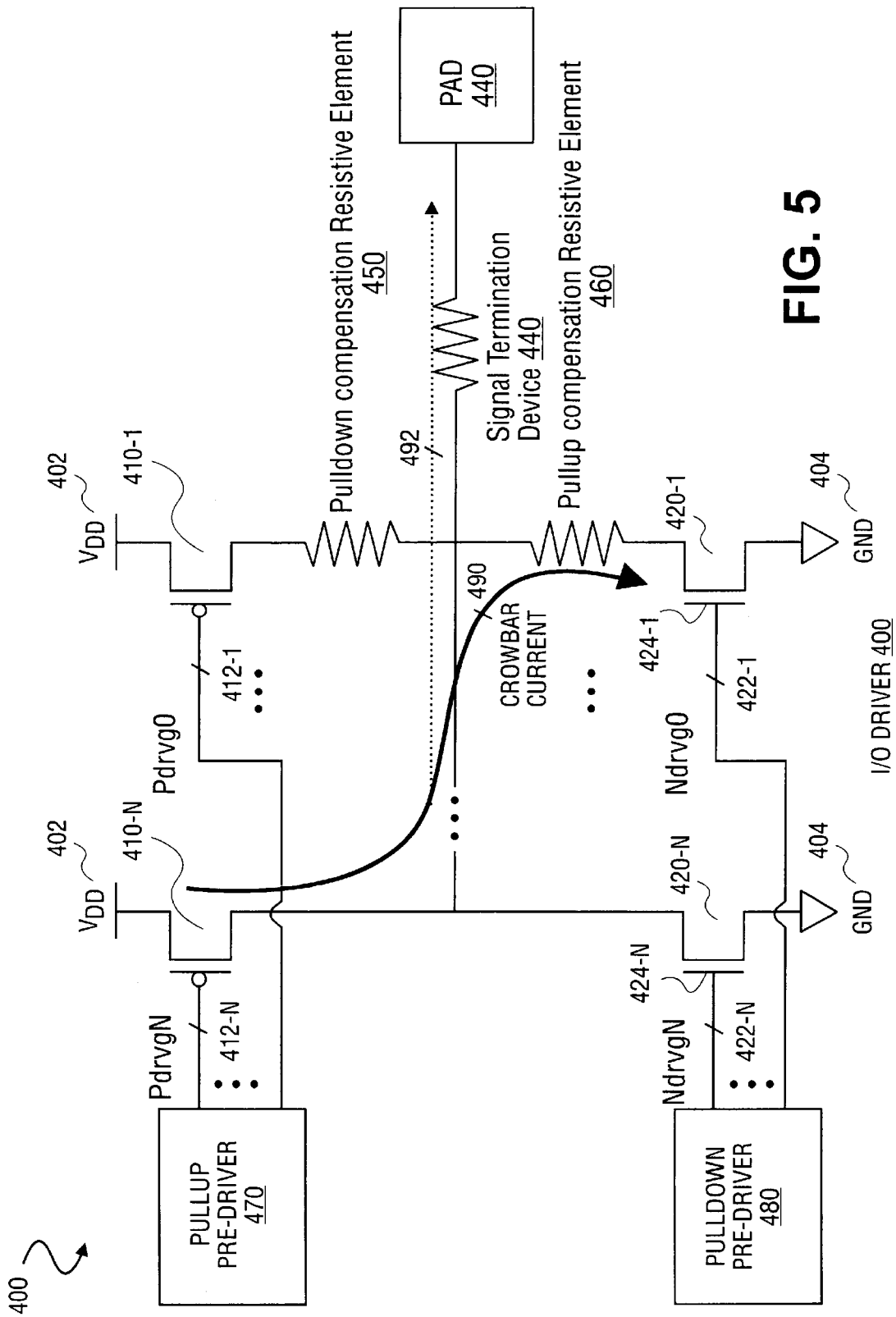
FIG. 5 depicts a block diagram illustrating an I/O driver utilizing analog compensation of output driver signal slew rate against device impedance variation in accordance with one embodiment of the present invention.
Figure 6:
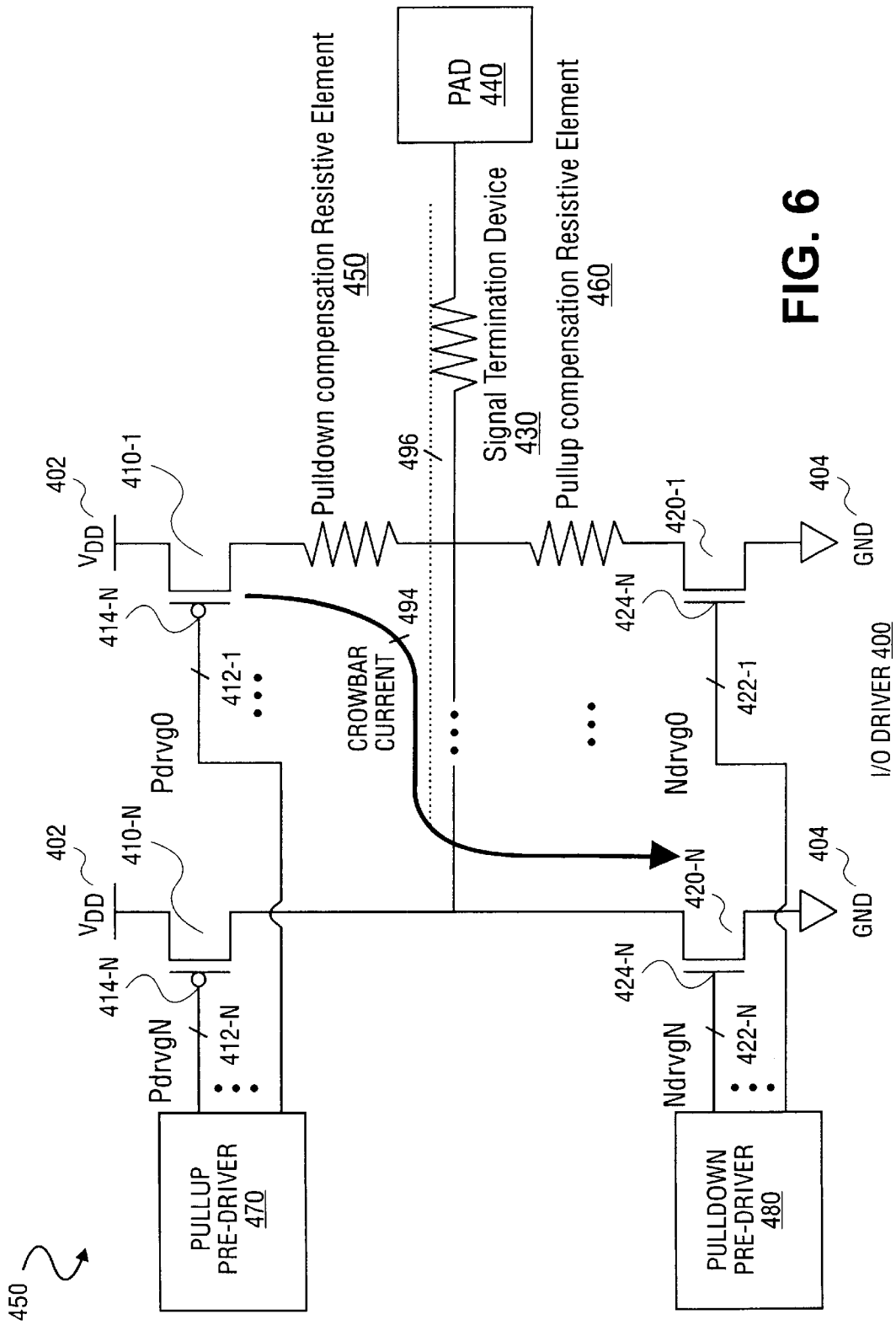
FIG. 6 depicts a block diagram illustrating the driver, as depicted in FIG. 1, during a falling signal transition in accordance with a further embodiment of the present invention.

Referring now to FIGS. 5 and 6, FIGS. 5 and 6 depict an I/O driver 400, which utilizes a pair of compensation resistive elements (450 and 460) in order to provide compensation for resistive variation of signal termination devices, which utilize an Nwell resistor 430. Accordingly, as illustrated, the I/O driver 400 includes a plurality of pull-up devices 410 (410-1, . . . , 410-N), which are activated by a pull-up pre-driver 470. In the embodiment depicted, the pull-up drivers are illustrated as metal-oxide-semiconductor (MOS) field-effect transistors (FETS) (MOSFET) device. In the embodiment depicted, the pull-up devices are illustrated as P-type MOS set devices, such that a negative or zero voltage level at a gate 414 of the pull-up devices turns on the devices.

Accordingly, as illustrated, the MOSFET devices are illustrated as switch level models. The I/O driver 400 further includes a plurality of pull-down devices 420 (420-1, . . . , 420-N). In the embodiment illustrated, the pull-down devices are illustrated as N-type MOSFET devices, such that a positive voltage level at gate 424 turns on the devices. As such, the pull-down devices are activated by pull-down pre-driver 480, which generates pull-down signals (NDRVGN 422-N and NDRVG0 422-1).

As such, although the I/O driver 400 is illustrated utilizing MOSFET devices to achieve rising and falling signal transitions, the embodiment depicted such not be construed in a limiting sense, as it is merely intended to provide an example of the present invention, whether than to provide an exhaustive list of all possible implementations of the present invention. In addition, in practice, I/O drivers may utilize any number of pull-down and pull-up devices. As such, the pair of pull-up and pull-down devices illustrated in FIGS. 5 and 6 are provided in order to avoid obscuring the details of the present invention.

Referring again to FIG. 5, and in contrast to the conventional I/O driver 100 as depicted in FIG. 1, the I/O driver 400 makes use of crowbar current 490. As known to those skilled in the art, a crowbar current occurs when opposing legs, which are normally turned off in order to generate either a rising signal transition or falling signal transition remain active for all or a portion of the signal transition. Accordingly, when an opposing leg is left on, a current will flow through the opposing leg and provide contention with the rising or falling signal transition.

For example, as depicted in FIG. 5, FIG. 5 illustrates a rising signal transition in I/O driver 400, while FIG. 6 depicts a falling signal transition in I/O driver 400. Accordingly, during a rising signal transition, pull-down devices 420 will generally be turned off and simultaneously, one or more of the pull-up devices 410 may be turned on. However, if, for example, a weak pull-down leg of the I/O driver, such as for example pull-down leg 420-1, is left on during a portion or all of the rising signal transition, a crowbar current 490 is generated, which flows from pull-up device 410 through pull-down device 420-1 and through ground 404.

However, during a rising signal transition, the pull-up devices are trying to provide a current 492 to the I/O driver output pad 440 in order to raise the voltage level at the output pad 440 in order to indicate a rising signal transition. Unfortunately, the crowbar current 490 will, in effect, slow down the rising signal transition at the driver output pad 440 by diverting a portion of the pull-up current 492 through pull-down leg 420-1. Generation of the crowbar current is further illustrated with reference FIGS. 7A and 7B.

Figure 7:
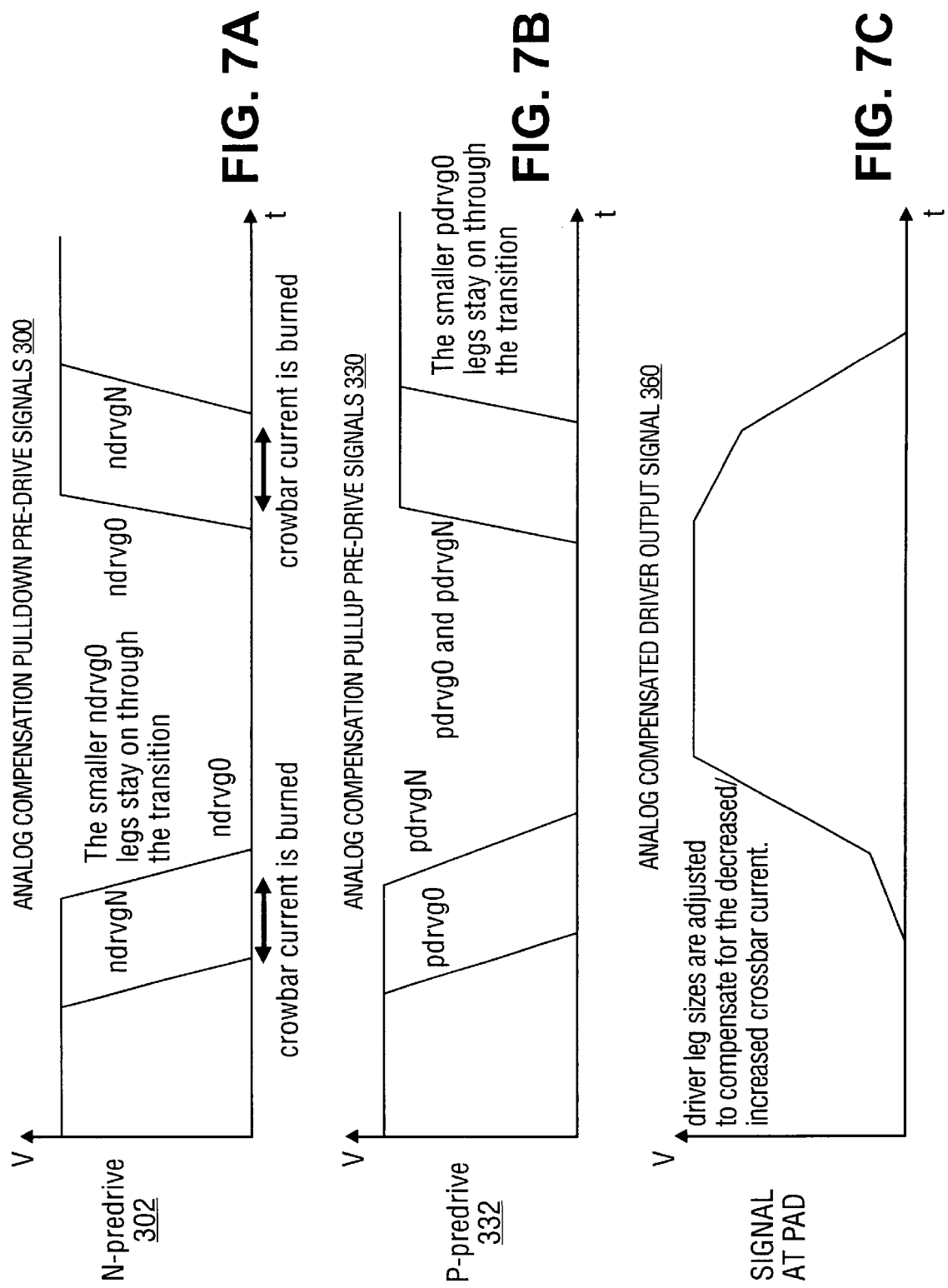
FIGS. 7A–7C depict timing diagrams illustrating analog compensation of a driver output signal slew rate against device impedance variation in accordance with one embodiment of the present invention.

As illustrated in FIG. 7A, FIG. 7A depicts analog compensation pull-up pre-drive signals 300, while FIG. 7B depicts analog compensation pull-down pre-drive signals 330. Accordingly, as illustrated by FIGS. 7A and 7B, while a conventional I/O driver as depicted in FIG. 1 would de-activate pull-down legs simultaneously in order to begin a rising signal transition, a weaker of the pull-down legs, for example pull-down leg 420-1, is left on by delaying de-activation of the NDRVG0 signal 422-1. As such, until the NDRVG0 signal is deactivated in FIG. 7A, crowbar current 490 will flow through the weaker pull-down leg 420-1 as illustrated in FIG. 5.

In contrast, during a falling signal transition, instead of simultaneously deactivating the pull-up legs 410, a weaker of the pull-up legs, for example pull-up leg 410-1 is left on by delaying de-activation of the PDRVG0 signal. As such, until the PDRVG signal is deactivated in FIG. 7B, crowbar current 499 will flow from the driver supply voltage 402 through the stronger of the pull-down legs, such as for example pull-down leg 420-N as illustrated in FIG. 6.

Although crowbar current is generally considered an undesirable effect, utilizing the teachings of the present invention, the crowbar current 490/494 may be utilized in order to provide analog compensation of variations in the driver impedance due to utilizing, for example an Nwell resistor as signal termination device 430. As will be described in further detail below, the I/O driver 400 utilizes a pair of Nwell compensation resistive elements 450 and 460, which are coupled in series with the weaker of the pull-up and pull-down legs and connected to the signal termination device 430. As such, during fabrication of the I/O driver 400, the I/O driver 400 may be simulated based on a selected resistance level of the signal termination device 430.

Based on the simulation, the compensation resistor levels may be selected in order to achieve an output driver slew rate, which is between 0.4 v/ns and 1.0 v/ns. As such, the slew rate refers to a slope of the rising or falling signal transition, which in one embodiment is between 0.4 v/ns and 1.0 v/ns. However, once the I/O driver is fabricated, the variation in the Nwell resistor material will either increase or decrease resistance of both the compensation resistors 450 and 460, as well as the signal termination 430. As such, assuming for example that the termination device 430 achieves an excessive resistive level, the compensation resistors 450 and 460 will also achieve a final excessive resistive level.

Consequently, referring again to FIG. 5, assuming a rising signal transition, the rising signal transition will be drastically slowed. In other words, the excessive resistive level of the termination device 430 will limit the amount of current which is provided to the pad 440 in order to raise the pad voltage level to indicate a rising signal transition. However, the crowbar current 490 will also be decreased by an equivalent proportion. Consequently, by decreasing the amount of crowbar current from the amount determined during the initial circuit simulation, the I/O driver 400 will achieve an output driver slew rate that is within the desired slew rate of 0.4 v/ns and 1.0 v/ns.

In contrast, assuming the final fabricated resistive level of the termination resistor 430 is very low, the resistive level of the compensation resistive elements will also be very low. As described above, when the resistive level is too low, the current 492 flow into the driver output pad 440 will be at a very high level, which will cause the output pad voltage level to have an excessive slew rate. However, due to the fact that the compensation resistive elements 450 and 460 will be set to a very low resistance level, the compensation resistive elements 450 and 460 will allow an increased crowbar current 490/494, which will provide contention with the signal transition current 492/496 and slow down the slew rate of the driver output pad output signal. Consequently, the output pad output signal slew rate will remain within the predetermined range, as described above.

Referring now to FIG. 6, FIG. 6 illustrates a falling signal transition within the I/O driver 400. As illustrated, the crowbar current 492 is generated by delaying deactivation of the weak pull-down leg 410-1 during a falling signal transmission. Assuming the I/O driver 400 is fabricated with a resulting termination device resistance at an extremely high resistance value, the pull-down current 496 will be reduced in magnitude due to the high resistance level. However, the compensation resistive element 450 will also have a drastically increased resistive level, which increases proportionally to the termination resistive level. As such, the crowbar current 492 will be drastically reduced beyond the simulated crowbar current level. As a result, the decreased crowbar current 494 will compensate for the decreased pull-down current 496.

Consequently, the pull-down current 496 will be less effected by the presence of crowbar current, 494 resulting in an output signal slew rate, which is within the predetermined range. In contrast, if the Nwell resistive material is fabricated with a final resistance level which is too low, the pull-down current 496 will be increased by a dramatic amount. However, the crowbar current 494 will also be increased by the exact amount or a magnitude thereof and provide contention with the pull-down current 496. This signal contention will slow down the falling signal transition. As a result, the final slew rate of the output signal at the driver output pad 440 is compensated to remain within the predetermined range.

Accordingly, as illustrated by FIG. 7C, the output driver signal slew rates will be compensated by either increased or decreased crowbar current, resulting in an output signal slew rate, which is within the predetermined range. Accordingly, I/O drivers utilizing the teachings of the present invention are capable of interfacing with legacy devices, which use Nwell termination resistive elements. In addition, although FIGS. 5 and 6 are illustrated with resistors as the compensation resistive elements 450 and 460, those skilled in the art will appreciate that other types of resistive elements may be utilized, such as transistors or other resistive elements as know to those skilled in the art. Other such devices may be used as compensation elements, provided their resistance varies in correspondence with the primary termination device.

Figure 8:
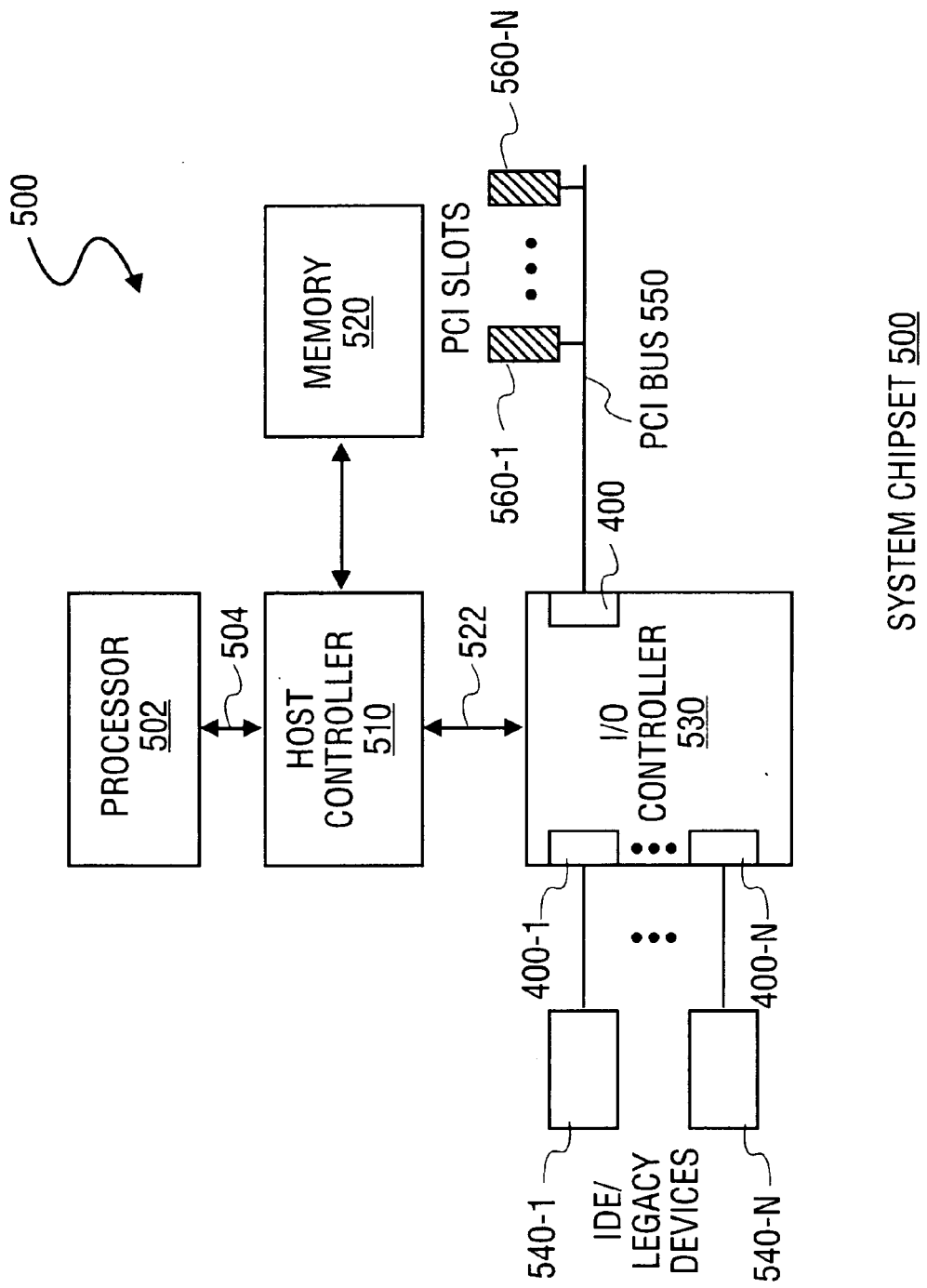
FIG. 8 depicts a block diagram illustrating a system chipset utilizing a driver, as depicted in FIGS. 5 and 6, in accordance with a further embodiment of the present invention.

Referring now to FIG. 8, FIG. 8 depicts a block diagram illustrating a system chipset 500 utilizing I/O drivers 400, which implement compensation resistive elements in order to compensate the driver output signal slew rate against device impedance variation, in accordance with a further embodiment of the present invention. As depicted, the system chipset includes a processor coupled to a host controller 510 via, for example a front side bus 504. The host controller 510 is coupled to memory 520 via, for example a memory bus. I/O controller 530 is also coupled to host controller 510 via, for example a system bus 522.

The I/O controller 530 utilizes I/O drivers including compensation resistive elements in order to maintain output signal slew rates within a predetermined range. The drivers 400 coupled to a peripheral component interconnect (PCI) bus 550, which is coupled to one or more PCI slots 560 (560-1, ..., 560-N). In addition, the I/O controller 530 includes a plurality of I/O drivers 400 (400-1, ..., 400-N) for coupling to one or more IDE or legacy devices 540 (540-1, ..., 540-N). As a result, the I/O controller 530 can utilize I/O drivers which include on-chip signal termination provided via Nwell resistors. Nwell resistors are selected based on their lower cost, as well as requiring a minimal die area when fabricated.

Consequently, using compensation resistive elements as depicted in FIGS. 3 and 4 within I/O drivers 400, the I/O controller 500 can ensure that the output signal slew rate to communicate with either the PCI slots 560 or IDE devices 540 is within a predetermined range. In addition, when device impedance variations occur within the resistive elements of the driver 400, such as the signal termination device, the compensation resistive elements will provide analog compensation of the output driver signal slew rate due to the fact that the variations between the signal termination device, as well as the compensation resistive elements, will be equal in magnitude.

Figure 9:
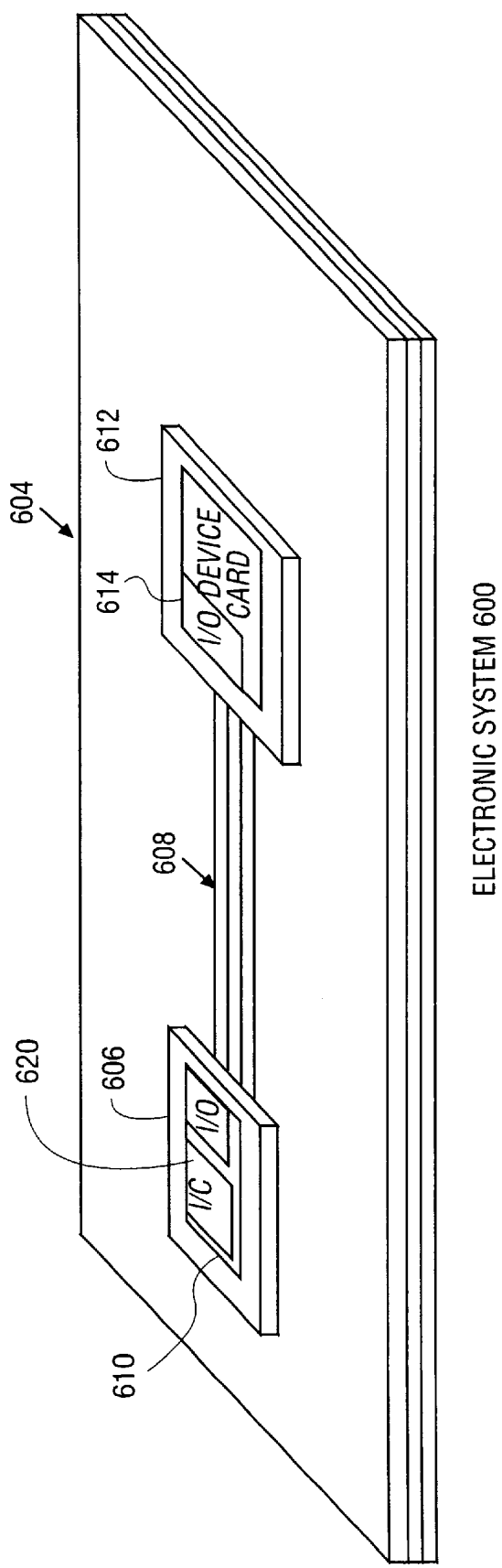
FIG. 9 depicts a block diagram illustrating an electronic system utilizing a driver, as depicted in FIGS. 5 and 6, in accordance with a further embodiment of the present invention.

Turning now to FIG. 9, what is shown is a block diagram of an embodiment of an electronic system 600 in which an input/output I/O sections utilizes compensation resistive elements as described above. The system has a multilayer printed wiring board 604 on which a parallel bus 608 is formed. The bus 608 may be of the point-to-point variety, or multi-drop buses, such as those used in a main memory. An integrated circuit (IC) chip packet 606 is operatively installed on the board to communicate using the parallel bus 608.

In one embodiment, installation of the package 606 may be done by a surface mount technique or via a connector or socket. The package includes an IC chip (chipset) 610 that includes a logic function section and an I/O section (driver/receiver) as an interface between the logic function section and the bus 608. The logic function may be one of the following well-known devices: a microprocessor, a memory controller, an I/O controller hub, an integrated driver electronics (IDE) output driver, or the like. Alternatively, other devices that can be implemented in the logic function section of an IC chip may be used.

In the embodiment described, the I/O section includes a chipset driver which utilizes a pull-up compensation resistive element and a pull-down compensation resistive element, which are set to provide resistive analog compensation of driver output slew rate against impedance variation. A second IC chip package 612 is also installed on the board 604 to communicate with the first package 606 via the bus 608. The second IC package 712 also includes a chip 614 having an I/O section in which a chipset receiver is provide to interface the bus 608 and its own function logic section (here shown as a device plug-in card).

According to an embodiment, the I/O interfaces of the two chips 610 and 612 may communicate with each other bi-directionally, that is using the same conductive lines of the bus for both transmitting and receiving data. Thus, in such an embodiment, drivers are provided in both IC chips that are connected to the same conductive lines of the bus 608. Other system applications of the compensation resistance are possible, including for example, virtually any chipset driver which is limited by variations of device impedance which cause slow rate variations which signals must propagate and reach a destination at a desired signal level. Procedural methods for implementing circuit design automation of the I/O driver claimed by the present invention are now described.

Circuit Design Automation

Figure 10:
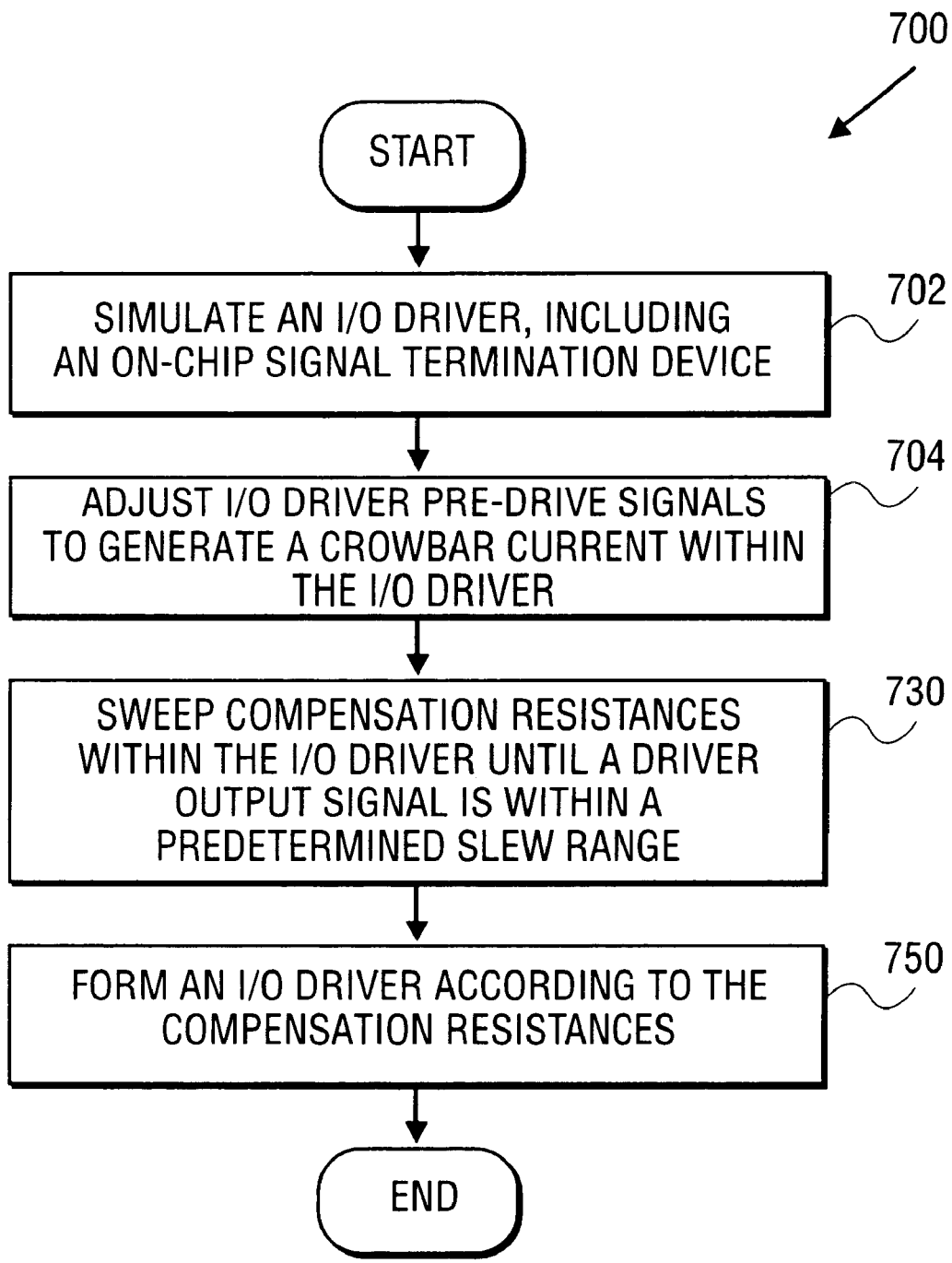
FIG. 10 depicts a flowchart illustrating a method for providing analog compensation of a driver output signal slew rate against device impedance variation, in accordance with one embodiment of the present invention.

Referring now to FIG. 10, FIG. 10 depicts a method for circuit design automation 700 to generate a driver, which utilizes analog compensation of driver output signal slew rate against device impedance variation, for example as depicted in FIGS. 5 and 6. Accordingly, the procedural methods illustrated with reference to FIGS. 10–16 enable circuit design automation when embodied within a computer readable storage medium. As described above, the computer readable medium embodying the procedural methods described herein includes any type of media/machine-readable medium suitable for storing electronic instructions.

Referring again to FIG. 10, at process block 702, an I/O is simulated, including a signal termination device set to a predetermined resistance level. The predetermined resistance level is determined in compliance with design specification documents describing a device to be fabricated. Once the I/O driver is simulated, at processor block 704, the pre-drive signals are adjusted so that crowbar current is generated within the simulated I/O driver 400. Next, at process block 730 compensation resistances within the I/O driver are swept until a driver output signal is within a predetermined slew rate range.

In one embodiment, the predetermined slew rate range is between 0.4 v/ns and 1.0 v/ns and as described above, refers to the slope during the rising or falling signal transition at an output pad of the I/O driver. Finally, at process block 750 an I/O driver is formed according to the determined compensation resistances. As such, the compensation resistances provide analog compensation of a driver output signal slew rate against device impedance variation. As described above, device impedance variation refers to situations where the fabricated resistance levels of the signal termination device within the I/O driver fluctuates by as much as 300%.

Figure 11:
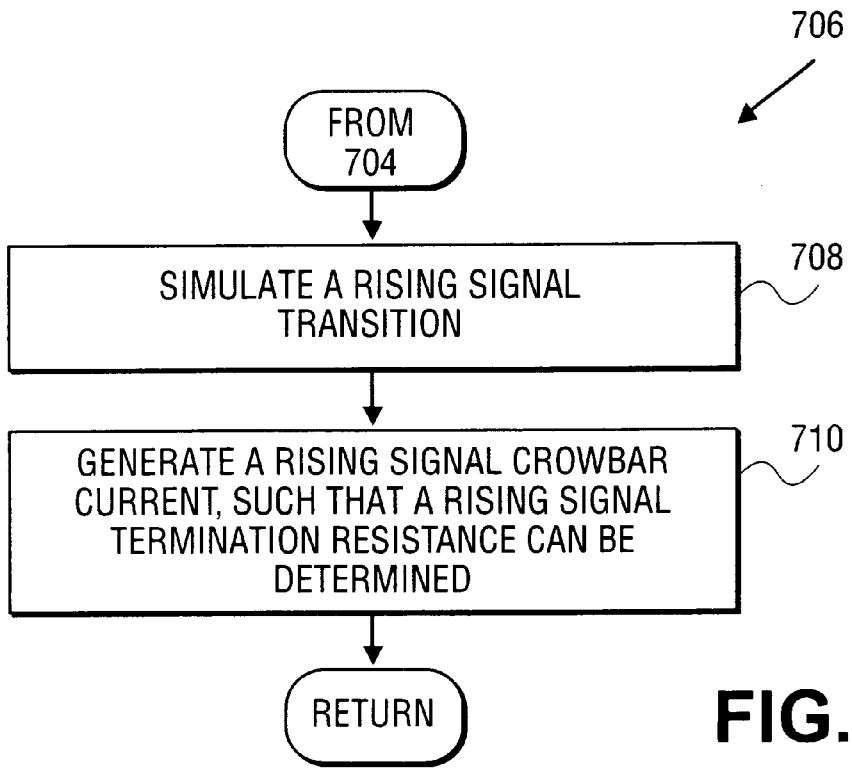
FIG. 11 depicts a flowchart illustrating an additional method for simulating an I/O driver in accordance with a further embodiment of the present invention.

Referring now to FIG. 11, FIG. 11 depicts a flowchart illustrating an additional method 706 for generating the crowbar current within the I/O driver, such as I/O driver 400 as depicted in FIGS. 5 and 6. At process block 708, a rising signal transition is simulated within the I/O driver 400, for example as depicted in FIG. 5. Once simulated, during the rising signal transition, a rising signal crowbar current 490 is generated, such that a rising signal termination resistance can be determined. For example as described above, the compensation resistance is determined according to the additional method 706, as depicted in FIG. 11, for a rising signal transition. As such, compensation resistive element 460 is swept until a slew rate of the driver output signal and pad 440 is within the predefined slew rate range.

Figure 12:
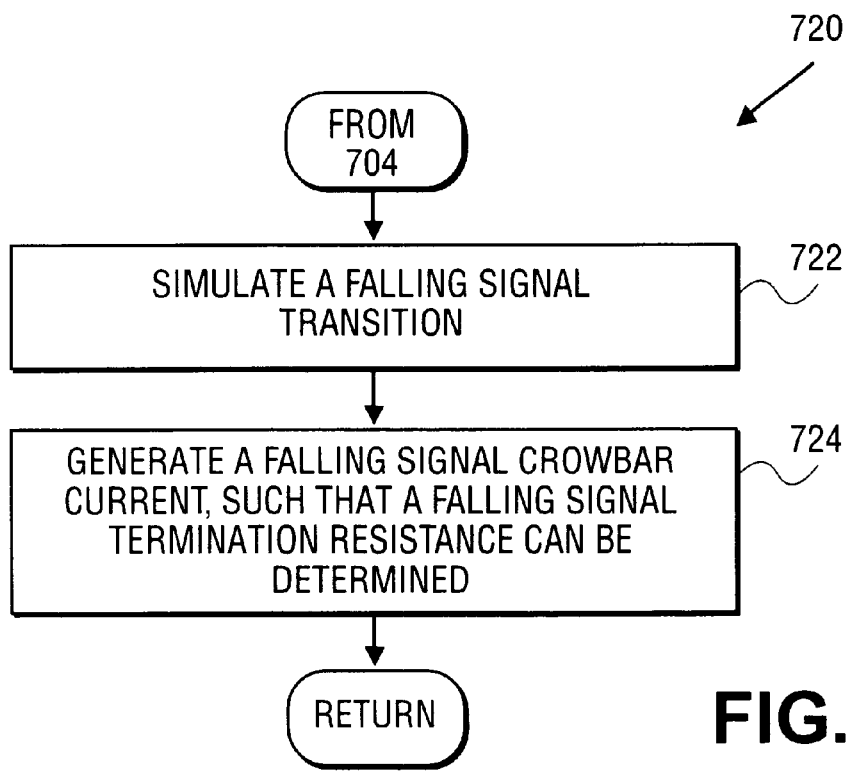
FIG. 12 depicts a flowchart illustrating an additional method for generating a crowbar current in accordance with a further embodiment of the present invention.

Referring now to FIG. 12, FIG. 12 depicts a flowchart illustrating an additional method 710 for generating the crowbar current of process block 704, as depicted in FIG. 10, in order to determine a compensation resistive element resistance for a falling signal transition. At process block 722, a falling signal transition is simulated within an I/O driver 400, as depicted in FIG. 6. At process block 724 during the falling signal transition, a falling signal crowbar current 494 is generated by, for example failing to de-activate a weaker of the pull-up legs, such as for example pull-up leg 410-1, during all or a portion of the falling signal transition. Accordingly, during this falling signal transition, the resistance of compensation resistor 450 is swept until an output signal slew rate at the driver output pad 440 is within the predetermined slew rate range.

Figure 13:
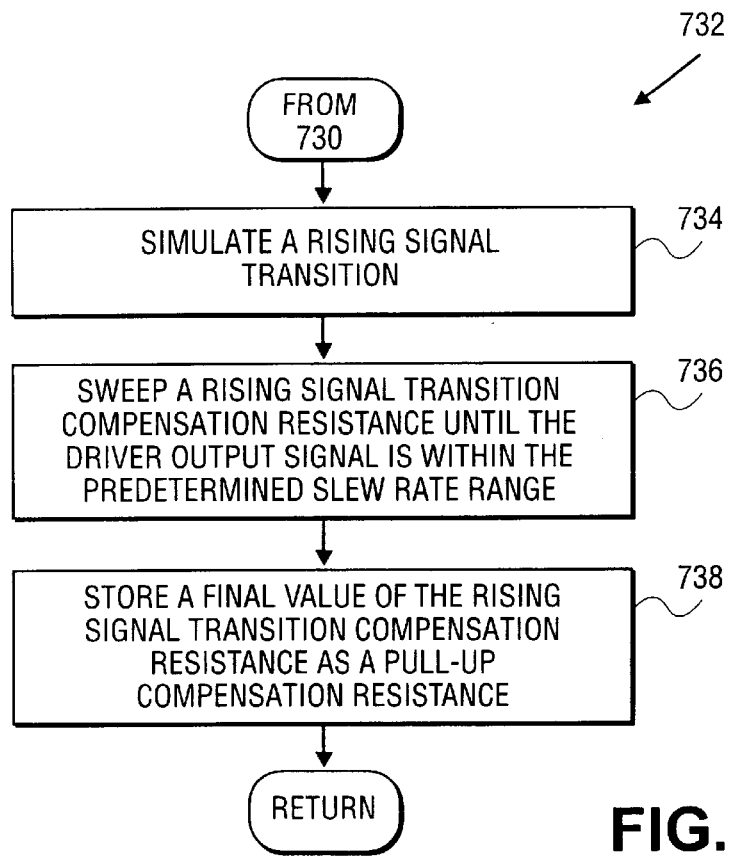
FIG. 13 depicts a flowchart illustrating an additional method for sweeping a compensation resistance in accordance with a further embodiment of the present invention.

Referring now to FIG. 13, FIG. 13 depicts a flowchart illustrating an additional method 732 for sweeping the compensation resistance of process block 730, as depicted in FIG. 10. At process block 734, a rising signal transition is simulated within the I/O driver 400. Once simulated, at process block 736, a rising signal transition compensation resistance is swept until the driver output signal is within the predetermined slew rate range. As illustrated with reference to FIG. 5, the compensation resistive element 460 is swept during such rising signal transition.

As described above, the sweeping of the resistance level of compensation resistive element 460 will affect crowbar current 490 in order to provide adequate compensation of the output driver signal slew rate to come within the predetermined slew rate range. Finally, at process block 738, a final value of the rising signal transition compensation resistance is stored as a pull-up compensation resistance. Accordingly, the ideal resistance value of compensation resistive element 460 is stored in order to enable formation of an I/O driver utilizing the compensation resistance value.

Figure 14:
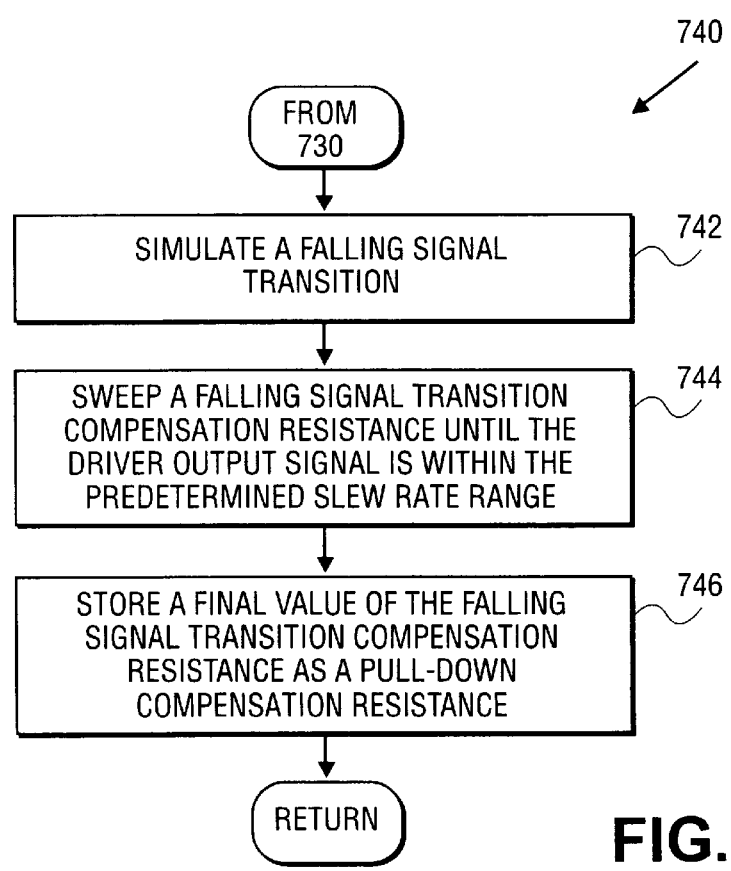
FIG. 14 depicts a flowchart illustrating an additional method for sweeping the compensation resistance in accordance with a further embodiment of the present invention.

Referring now to FIG. 14, FIG. 14 depicts an additional method 740 for sweeping the compensation resistance of process block 730 during a falling signal transition, as depicted in FIG. 10. At process block 742, a falling signal transition is simulated with an I/O driver 400, for example as depicted in FIG. 6. Next, at process block 744, a falling signal transition compensation resistance is swept until the driver output signal is within the predetermined slew rate range. In one embodiment, the falling-signal transition compensation resistance refers to the resistance value of compensation resistive element 450

As depicted with reference to FIG. 6, the resistance value of compensation resistive element 450 is swept until the output driver slew rate is within the desired slew rate range. As illustrated, sweeping of the resistance value of compensation resistive element 450 will vary crowbar current 494 until pull-down current 496 is adequately compensated in order to provide an acceptable output driver slew rate range. Finally, at process block 746, a final value of the falling signal transition compensation resistance is stored as a pull-down compensation resistance value.

Figure 15:
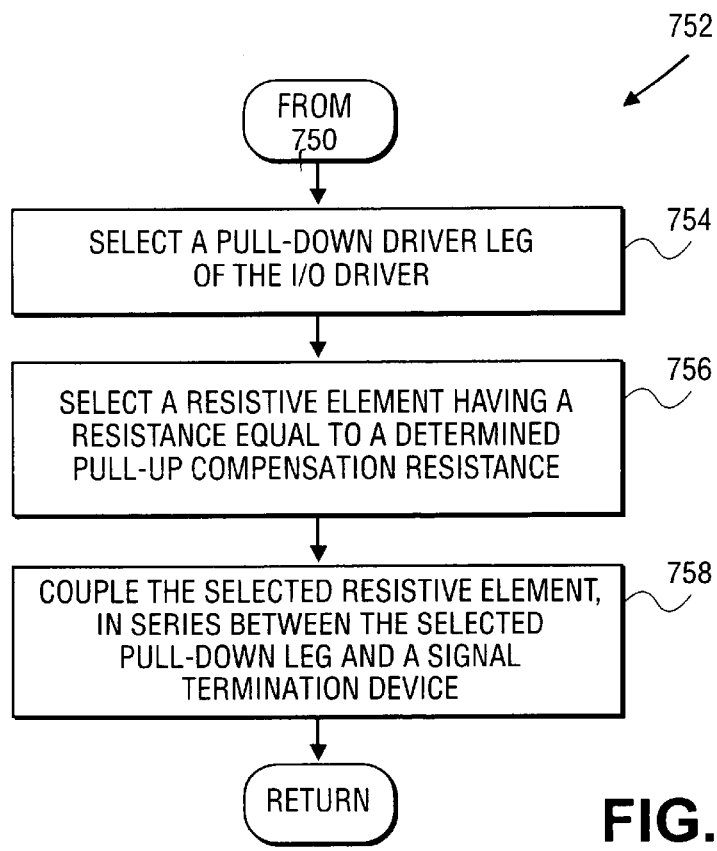
FIG. 15 depicts a flowchart illustrating an additional method for formation of an I/O driver in accordance with an exemplary embodiment of the present invention.

Referring now to FIG. 15, FIG. 15 depicts a flowchart illustrating an additional method 752 for forming the I/O driver 400 of process block 750, as depicted in FIG. 8. Accordingly, FIG. 13 depicts formation of an I/O driver 400 for providing compensation during a rising signal transition, such as depicted in FIG. 5. At process block 754, a pull-down leg of the I/O driver 400 is selected, such as for example pull-down leg 420-1. Next, at process block 756, a compensation resistive element is selected having a resistance equal to a determined pull-up compensation resistance.

As described above, the resistance of the compensation resistive element 460 is set to, for example, the pull-up compensation resistance determined at process block 746 of FIG. 14. Finally, at process block 758, the selected resistive element is coupled in series between the selected pull-down leg 420-1 and a signal termination device 430 of the I/O driver 400. Accordingly, as illustrated in FIG. 6, compensation resistive element 460 would be selected having a resistance value equal to the previously determined pull-down compensation resistance. As illustrated, the compensation resistive element 460 is coupled in series between the weak pull-up leg 410-1 and the signal termination device 430.

As illustrated with reference to FIG. 6, the I/O driver illustrates pull-down leg 420-1 as the weak pull-down leg to which the compensation resistor 460 is coupled. However, those skilled in the art will appreciate that FIG. 6 is provided to illustrate an example of the present invention and should not be construed in the limiting sense. As such, any of the one or more pull-down legs 420 of I/O driver 400 may be selected from which to add a compensation resistive element. In addition, one or more compensation resistive elements may be utilized as desired during circuit simulation of the I/O driver 400.

Figure 16:
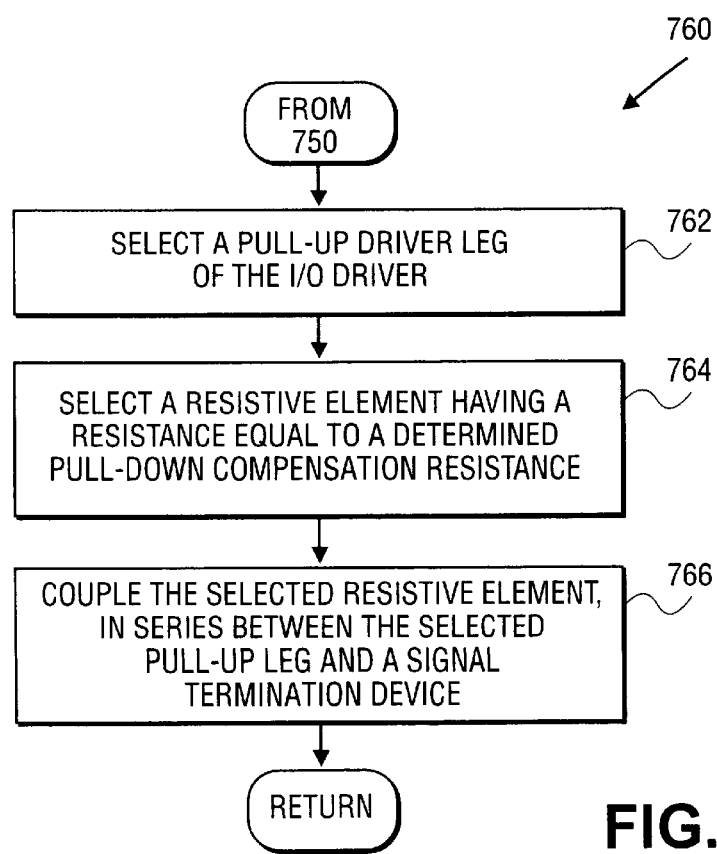
FIG. 16 depicts a flowchart illustrating an additional method for forming an I/O driver in accordance with a further embodiment of the present invention.

Finally, referring to FIG. 16, FIG. 16 depicts formation of the I/O driver of process block 750, as depicted in FIG. 10, for example to generate an I/O driver 400 as depicted in FIG. 6, to illustrate a falling signal transition. At process block 462, a pull-up driver leg of the I/O driver 400 is selected. As illustrated in FIG. 5, the pull-up leg selected is pull-up leg 410-1. Next, at process block 764, a resistive element having a resistance equal to a determined pull-up leg compensation resistance value determined at process block 764 (FIG. 14) is selected. Finally, at process block 766, the selected resistive element is coupled in series between the selected pull-up leg 410-1 and the signal termination device 430 of I/O driver 400.

Accordingly, the circuit fabrication techniques, as described with reference to FIGS. 10–16, provides true analog compensation for the affects of impedance variation on the output driver slew rate without requiring additional pins as utilized by conventional digital compensation devices. As such, by detecting simulated compensation resistive values, as well as utilizing crowbar currents, I/O drivers fabricated in accordance with the teachings of the present invention will have resulting output driver signals that are compensated to remain within a desired output driver slew rate range. In other words, since the output driver control signals are tuned to control the duration and magnitude of the crowbar current flows, the present invention does not require any additional simulation beyond what is needed for normal output driver control. Moreover, the present invention results in reduced manufacturing costs and allows the use of inexpensive resistive elements to be used for on-chip signal termination.

Alternate Embodiments

Several aspects of one implementation of the I/O driver for providing analog compensation of driver output slew rate against device impedance variation have been described. However, various implementations of the pull-up and pull-down compensation resistive elements provide numerous features including, complementing, supplementing, and/or replacing the features described above. Features can be implemented as part of the I/O driver or as part of a controller hub in different implementations. In addition, the foregoing description, for purposes of explanation, used specific nomenclature to provide a thorough understanding of the invention. However, it will be apparent to one skilled in the art that the specific details are not required in order to practice the invention.

In addition, although an embodiment described herein is directed to an I/O driver, it will be appreciated by those skilled in the art that the teaching of the present invention can be applied to other systems. In fact, systems for utilizing on-chip signal termination are within the teachings of the present invention, without departing from the scope and spirit of the present invention. The embodiments described above were chosen and described in order to best explain the principles of the invention and its practical applications. These embodiment were chosen to thereby enable others skilled in the art to best utilize the invention and various embodiments with various modifications as are suited to the particular use contemplated.

It is to be understood that even though numerous characteristics and advantages of various embodiments of the present invention have been set forth in the foregoing description, together with details of the structure and function of various embodiments of the invention, this disclosure is illustrative only. In some cases, certain subassemblies are only described in detail with one such embodiment. Nevertheless, it is recognized and intended that such subassemblies may be used in other embodiments of the invention. Changes may be made in detail, especially matters of structure and management of parts within the principles of the present invention to the full extent indicated by the broad general meaning of the terms in which the appended claims are expressed.

The present invention provides many advantages over known techniques. The present invention includes the ability to provide a true analog compensation for the effects of termination resistance on the output driver slew rate, while not requiring any additional pins. The invention makes use of an already present feature of output drivers (crowbar current), which is often considered undesirable to produce effective slew rate compensation. Crowbar current is frequently used to control signal edge rates, but it has not been used to compensate for on-chip termination resistance variations before now.

Furthermore, the simplicity of the invention is unmatched by other compensation schemes. No additional circuitry is required other than the compensation resisters themselves. Moreover, the output driver signal must be tuned to control the duration that the crowbar current flows, but this does not add requirements beyond what is needed for normal output driver control. Furthermore, the invention saves manufacturing costs and allows the use of cheaper resistive elements to be used for on-chip signal termination. As a result, any manufacturer of integrated circuits containing on-die termination devices for high speed chip signaling could benefit from the present invention.

Having disclosed exemplary embodiments, modifications and variations may be made to the disclosed embodiments while remaining within the scope of the invention as defined by the following claims.

What is claimed is:

1. A method comprising:
   simulating an I/O driver including a signal termination device set to a predetermined resistance value;
   generating a crowbar current within the simulated I/O driver;
   sweeping a compensation resistance within the simulated I/O driver until a driver output signal is within a predetermined slew rate range; and
   forming an I/O driver according to the compensation resistance, such that the compensation resistance achieves analog compensation of a driver output signal slew rate against device impedance variation.

2. The method of claim 1, wherein generating the crowbar current further comprises:
   simulating a rising signal transition within the simulated I/O driver;
   during the rising signal transition, generating a rising signal crowbar current within the simulated I/O driver, such that a rising signal termination resistance can be determined.

3. The method of claim 1, wherein generating the crowbar current further comprises:
   simulating a falling signal transition within the simulated I/O driver;
   during the falling signal transition, generating a falling signal crowbar current within the simulated I/O driver, such that a falling signal termination resistance can be determined.

4. The method of claim 2, wherein sweeping the compensation resistance further comprises:
   simulating a rising signal transition within the simulated I/O driver;
   sweeping a rising signal transition compensation resistance within the simulated I/O driver until the driver output signal is within the predetermined slew rate range; and
   storing a final value of the rising signal transition compensation resistance as a pull-up compensation resistance.

5. The method of claim 2, wherein sweeping the compensation resistance further comprises:
   simulating a falling signal transition within the simulated I/O driver;
   sweeping a falling signal transition compensation resistance within the simulated I/O driver until the driver output signal is within the predetermined slew rate range; and
   storing a final value of the falling signal transition compensation resistance as a pull-down compensation resistance.

6. The method of claim 1, wherein forming the I/O driver further comprises:

selecting a pull-down driver leg of the I/O driver;

selecting a resistive element having a resistance equal to a determined pull-up compensation resistance; and coupling the selected resistive element, in series, between the selected pull-down leg and a signal termination device of the I/O driver.

7. The method of claim 1, wherein forming the I/O driver further comprises:

selecting a pull-up driver leg of the I/O driver;

selecting a resistive element having a resistance equal to a determined pull-down compensation resistance; and coupling the selected resistive element, in series, between the selected pull-up leg and a signal termination device of the I/O driver.

8. The method of claim 1, wherein the slew rate range is between 0.4 volts per nanosecond v/ns and 1.0 v/ns.

9. The method of claim 1, wherein forming the I/O driver further comprises:

selecting an Nwell resistor as the signal termination device;

selecting an Nwell resistor as a compensation pull-up resistive element; and selecting an Nwell resistor as a pull-down compensation resistive element.

10. A computer readable storage medium including program instructions that direct a computer to function in a specified manner when executed by a processor, the program instructions comprising:

simulating an I/O driver including a signal termination device set to a predetermined resistance value;

generating a crowbar current within the simulated I/O driver;

sweeping a compensation resistance within the simulated I/O driver until a driver output signal is within a predetermined slew rate range; and forming an I/O driver according to the compensation resistance, such that the compensation resistance achieves analog compensation of a driver output signal slew rate against device impedance variation.

11. The computer readable storage medium of claim 10, wherein generating the crowbar current further comprises:

simulating a rising signal transition within the simulated I/O driver;

during the rising signal transition, generating a rising signal crowbar current within the simulated I/O driver, such that a rising signal termination resistance can be determined.

12. The computer readable storage medium of claim 10, wherein generating the crowbar current further comprises:

simulating a falling signal transition within the simulated I/O driver;

during the falling signal transition, generating a falling signal crowbar current within the simulated I/O driver, such that a falling signal termination resistance can be determined.

13. The computer readable storage medium of claim 11, wherein sweeping the compensation resistance further comprises:

simulating a rising signal transition within the simulated I/O driver;

sweeping a rising signal transition compensation resistance within the simulated I/O driver until the driver output signal is within the predetermined slew rate range; and storing a final value of the rising signal transition compensation resistance as a pull-up compensation resistance.

14. The computer readable storage medium of claim 11, wherein sweeping the compensation resistance further comprises:

simulating a falling signal transition within the simulated I/O driver;

sweeping a falling signal transition compensation resistance within the simulated I/O driver until the driver output signal is within the predetermined slew rate range; and storing a final value of the falling signal transition compensation resistance as a pull-up compensation resistance.

15. The computer readable storage medium of claim 10, wherein forming the I/O driver further comprises:

selecting a pull-down driver leg of the I/O driver;

selecting a resistive element having a resistance equal to a determined pull-up compensation resistance; and coupling the selected resistive element, in series, between the selected pull-down leg and a signal termination device of the I/O driver.

16. The computer readable storage medium of claim 10, wherein forming the I/O driver further comprises:

selecting a pull-up driver leg of the I/O driver;

selecting a resistive element having a resistance equal to a determined pull-down compensation resistance; and coupling the selected resistive element, in series, between the selected pull-up leg and a signal termination device of the I/O driver.

17. The computer readable storage medium of claim 10, wherein the slew rate range is between 0.4 volts per nanosecond v/ns and 1.0 v/ns.

18. The computer readable storage medium of claim 10, wherein forming the I/O driver further comprises:

selecting an Nwell resistor as the signal termination device;

selecting an Nwell resistor as a compensation pull-up resistive element; and selecting an Nwell resistor as a pull-down compensation resistive element.

* * * * *